(12) United States Patent
Auerbach et al.

(10) Patent No.: US 6,618,506 B1
(45) Date of Patent: Sep. 9, 2003

(54) METHOD AND APPARATUS FOR IMPROVED COMPRESSION AND DECOMPRESSION

(75) Inventors: Daniel Jonathan Auerbach, San Jose, CA (US); Timothy Michael Kemp, San Jose, CA (US); Robert Kevin Montoye, Cold Spring, NY (US); John Davis Palmer, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 08/936,201

(22) Filed: Sep. 23, 1997

(51) Int. Cl.[7] .................. G06K 9/36; H03M 7/34; G06F 15/00; G06F 9/45
(52) U.S. Cl. .................. 382/232; 341/51; 712/210; 717/151
(58) Field of Search .................. 382/232, 239, 382/245–247; 341/51, 67; 348/404–407, 419; 358/261.2, 430; 395/381, 800.24; 712/210, 225; 717/151, 157

(56) References Cited

U.S. PATENT DOCUMENTS

| | | | |
|---|---|---|---|
| 5,604,499 A | * | 2/1997 | Miyagoshi et al. ............ 341/67 |
| 5,632,024 A | * | 5/1997 | Yajima et al. ............... 395/381 |
| 5,764,994 A | * | 6/1998 | Craft .......................... 717/159 |
| 5,787,302 A | * | 7/1998 | Hampapuram et al. 395/800.24 |
| 5,905,893 A | * | 5/1999 | Worrell ....................... 717/151 |
| 5,935,240 A | * | 8/1999 | Mennemeier et al. ....... 712/225 |
| 6,041,403 A | * | 3/2000 | Parker et al. ............... 712/210 |
| 6,564,314 B1 | * | 5/2003 | May et al. ................... 712/210 |

FOREIGN PATENT DOCUMENTS

JP 08139611 A * 5/1996 ............ H03M/7/40

* cited by examiner

*Primary Examiner*—Wenpeng Chen
(74) *Attorney, Agent, or Firm*—Morgan & Finnegan, LLP

(57) ABSTRACT

A method and apparatus for compression and decompression of information, such as groups of computer program instructions, encodes (compresses) information comprising a plurality of units by receiving the information to be encoded, splitting the information into a plurality of subsets, each subset comprising a plurality of symbols, each symbol comprising at least a portion of a unit of information, and assigning a codeword to each symbol, for each subset. Preferably, the assignment is performed by determining the frequency of occurrence of each symbol, for each subset, and assigning a codeword to each symbol, based on the frequency of occurrence of each symbol, for each subset. In order to decode (decompress) encoded information, the information comprising a plurality of codewords, each codeword is decoded to form a symbol, each symbol is grouped into one of a plurality of subsets and the plurality of subsets is merged to form decoded information.

17 Claims, 9 Drawing Sheets

| 650 Codeword-Symbol Assignment Table ||
|---|---|
| 651 Symbol Group (3-bit Index Entries 00h-07h) | 652a Uncompressed Symbol <br> • <br> • <br> 652h Uncompressed Symbol |
| 653 Symbol Group (4-bit Index Entries 10h-1Fh) | 654a Uncompressed Symbol <br> • <br> • <br> 654p Uncompressed Symbol |
| 655 Symbol Group (5-bit Index Entries 20h-3Fh) | 656a Uncompressed Symbol <br> • <br> • <br> 656af Uncompressed Symbol |
| 657 Symbol Group (6-bit Index Entries 40h-7Fh) | 658a Uncompressed Symbol <br> • <br> • <br> 658bl Uncompressed Symbol |
| 659 Symbol Group (7-bit Index Entries 80h-FFh) | 660a Uncompressed Symbol <br> • <br> • <br> 660dx Uncompressed Symbol |

| 750 Compressed Image ||
|---|---|
| 752 Prefix | 754 Index/Literal |
| 01 | 010 |
| 00 | 01101001 11000011 |
| 110 | 110011 |

756a → (row 1)
756b → (row 2)
756c → (row 3)

762 Symbol Table

764 3-bit Group
```
000     00010001  00010001
001     00110011  00110011
010     01000100  01000100
```
•
•

766 6-bit Group
```
110010  00010010  00110100
110011  00100011  01000101
110100  00110100  01010110
```

770 Uncompressed Instructions

```
01000100  01000100
01101001  11000011
00100011  01000101
```

METHOD AND APPARATUS FOR IMPROVED COMPRESSION AND DECOMPRESSION

FIELD OF THE INVENTION

The present invention relates to a method and apparatus for compressing and decompression information organized in short blocks, such as computer program instructions

BACKGROUND OF THE INVENTION

With computer processors getting smaller and cheaper, and computer programs getting larger and more complex, the size and cost of a computer's memory for storing program information has become a significant portion of the cost of a computer solution. While memory cost is important in general purpose computer systems, such as personal computers, it becomes critical in embedded special-purpose computer devices, especially those used in low-cost products. Significant cost reductions in computer-based products may be realized by reducing the memory required by a particular program. One possible technique involves compressing the program instructions in memory.

Prior art data coding and compression schemes have most widely been used to compress data and code for storage on DASD or tape backup systems. Typically, such methods are directed toward achieving a high degree of compression on large blocks of data. Lossless data compression is used extensively in connection with storage of data on disk file systems, backup and archiving systems, and storage of data on tape. Such systems are typically implemented in software. Well known examples include disk compression products, such as the UNIX Compress program, or the DOS and OS/2 Stacker and pkZIP programs. Typically, these programs employ adaptive data compression techniques, such as LZ1 or LZ2.

The requirements for effective compression of data in the high speed memory of a computer system are very different than the requirements for compression of large blocks of data. Compression/decompression techniques for this application must be able to effectively handle short blocks of data. The data will be compressed once and decompressed repeatedly. Thus, the decompression scheme must be quick and efficient, while the compression scheme can be relatively slow and complex. What is needed is a compression/decompression technique that effectively handles short data blocks, while providing quick and efficient decompression.

SUMMARY OF THE INVENTION

The present invention is a method and apparatus for compression and decompression of information, such as computer program instructions, which provides quick and efficient decompression.

In order to compress information, the present invention encodes information comprising a plurality of units by receiving the information to be encoded, splitting the information into a plurality of subsets, each subset comprising a plurality of symbols, each symbol comprising at least a portion of a unit of information, by assigning a codeword to each symbol, for each subset. Preferably, the assignment is performed by determining the frequency of occurrence of each symbol, for each subset, and assigning a codeword to each symbol, based on the frequency of occurrence of each symbol, for each subset.

In one embodiment of the present invention, a codeword-symbol assignment table is generated, for each subset. Preferably each codeword includes an index indicating a location in the codeword-symbol assignment table and a prefix indicating a length of the index.

In another embodiment of the present invention, a plurality of symbol groups are generated for each codeword-symbol assignment table. Preferably each codeword includes prefix indicating one of the plurality of symbol groups and an index indicating a location in the indicated symbol group.

In order to decompress information encoded according to the present invention, the information comprising a plurality of codewords, each codeword is decoded to form a symbol, each symbol is grouped into one of a plurality of subsets and the plurality of subsets is merged to form decoded information.

Preferably, each codeword comprises an index indicating a location in a symbol group in a codeword-symbol assignment table and a prefix indicating a symbol group and a length of the index. An index may represent a literal symbol, and the prefix may further indicate whether the index represents a literal symbol.

BRIEF DESCRIPTION OF THE DRAWINGS

The details of the present invention, both as to its structure and operation, can best be understood by referring to the accompanying drawings, in which like reference numbers and designations refer to like elements.

FIG. 5b is an exemplary diagram of information at several steps of the compression process of FIG. 5a.

FIG. 7b is an exemplary diagram of information at several steps of the decompression process of FIG. 7a.

DETAILED DESCRIPTION OF THE INVENTION

Figure 1:
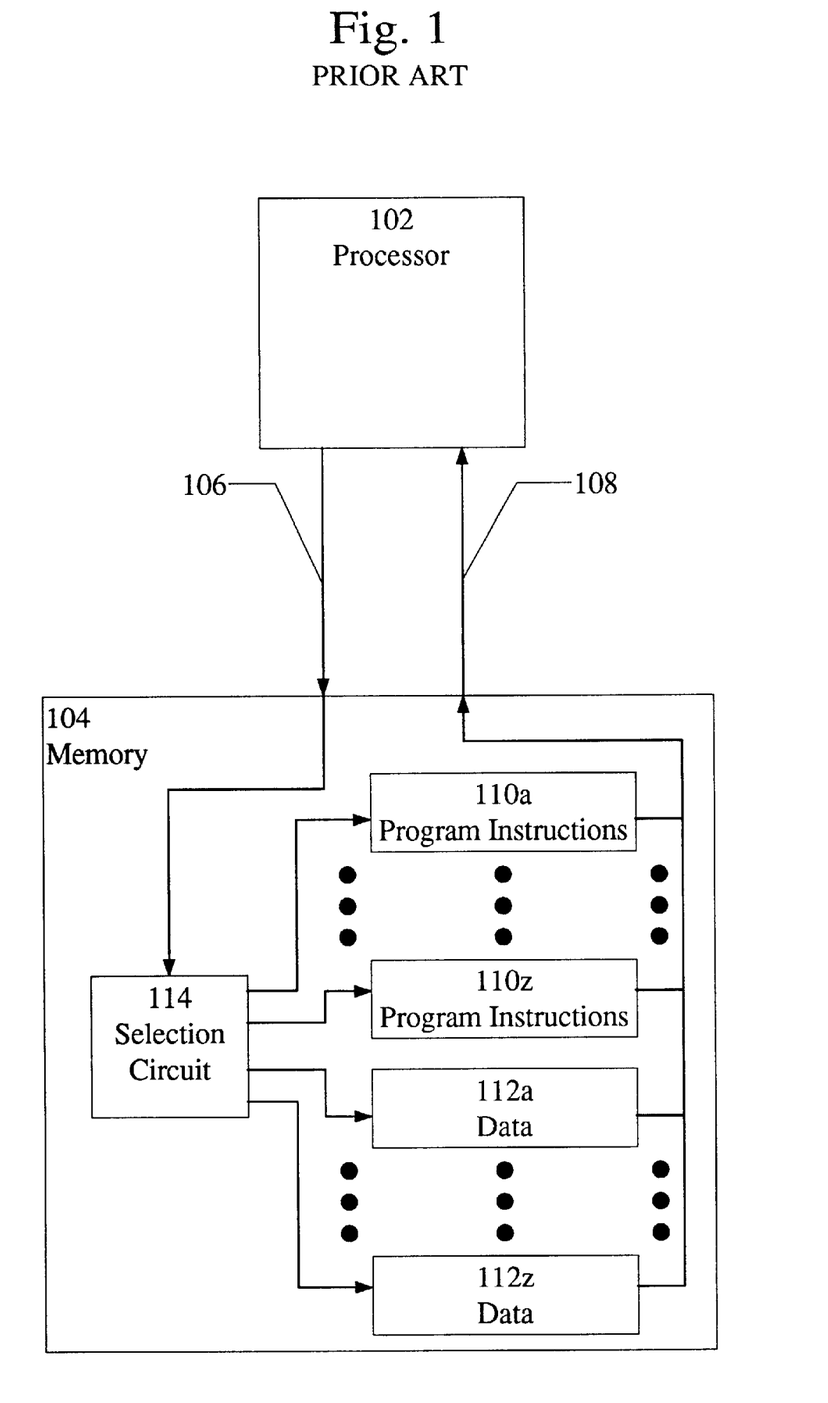
FIG. 1 is a block diagram of a prior art computer system.

FIG. 1 is a block diagram of a prior art computer system. Memory 104 stores information used by processor 102. In general, there are two types of information stored in memory 104. One type of information is program instructions 110a–z, which control the processing performed by processor 102. The other type of information is data 112a–z, which is information which is processed by processor 102. The program instructions 110a–z and data 112a–z are stored in memory 108 in the format required by processor 102. The information stored in memory 104 is stored in individually accessible locations, each of which has a corresponding address that identifies the location. In order to access the information stored in a particular location, processor 102 presents the address of the memory location to be accessed to memory 104 over address lines 106. The address is input to selection circuit 114, which decodes the address and selects the corresponding memory location. The information stored in the selected location is output to processor 102 over data lines 108.

Figure 2:
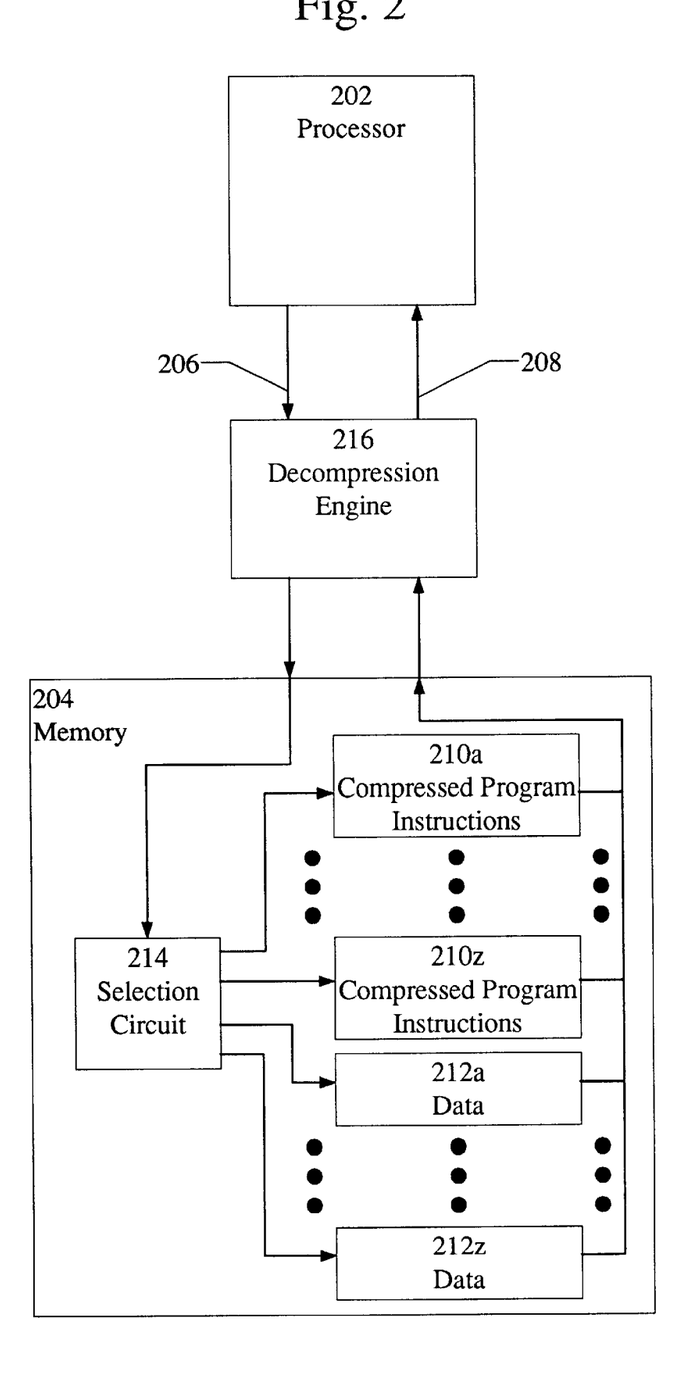
FIG. 2 is a block diagram of a computer system, according to the present invention.

A computer system, in accordance with the present invention, is shown in FIG. 2. Memory 204 stores the information used by processor 202. However, the program instructions may be stored in memory 204 in a compressed format. The instructions stored in the compressed format cannot be directly used by processor 202, but must be converted to the required uncompressed format by a process known as decompression. The advantage of storing the program instructions in a compressed format is that they occupy less space in memory. This allows a given program to be stored in a smaller memory, thus reducing the cost of the computer system.

One advantage of the present invention is that the decompression process is invisible to processor 202. Processor 202 need know nothing about the compressed program instructions. Processor 202 requests uncompressed instructions by presenting addresses on address lines 206 and receives uncompressed instructions on data lines 208. Decompression engine 216 performs the decompression process independently of processor 202. Decompression engine 216 takes the address, supplied by processor 202, accesses the appropriate memory location in memory 204, receives the compressed program instruction from memory 204, applies its decompression function to the compressed program instruction and supplies the uncompressed program instruction to processor 202. over data lines 208. The compression/decompression scheme is transparent to the processor.

Figure 3:
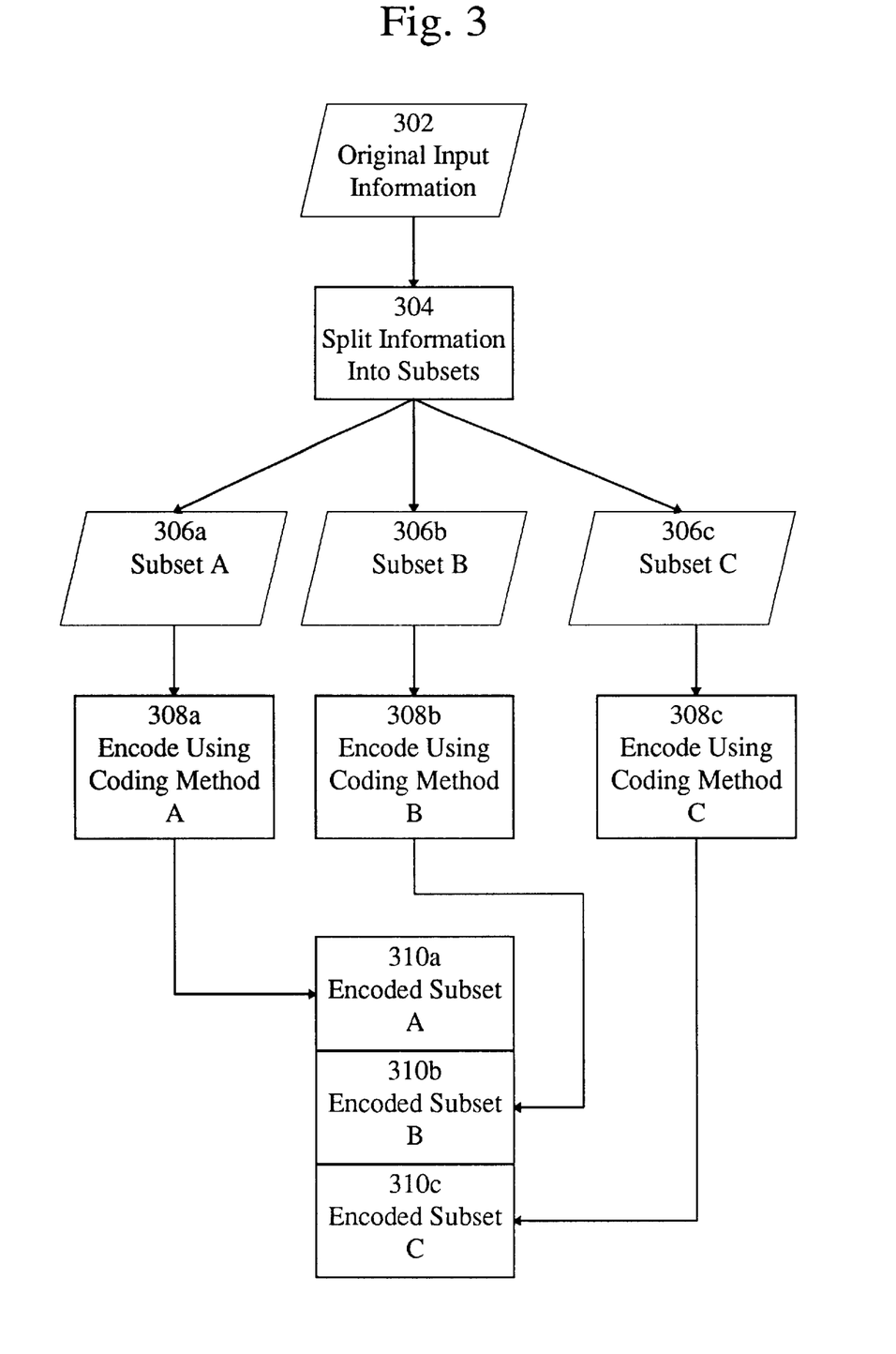
FIG. 3 is a data flow diagram of a compression process, according to the present invention.

A compression process, by which information is encoded to form compressed information, according to the present invention, is shown in FIG. 3. The process begins with step 304, in which original input information 302 is split into a plurality of subsets, for example subsets A, B and C 306a–c. In step 308, each subset 306a–c is individually encoded to form an encoded subset 310a–c. Each subset is encoded using a particular coding method, which may be the same coding method for all subsets or may be a different coding method for some or all subsets. For example, subset A 306a is encoded using coding method A, subset B 306b is encoded using coding method B, and subset C 306c is encoded using coding method C.

A There are a large number of ways in which subsets may be selected. The general method is able to accommodate almost any selection technique. The objective in splitting the information is to have each resulting subset be particularly suited to a particular coding technique. For example, text information may be separated from image information because the preferred encoding scheme for each type of information is different.

Figure 4:
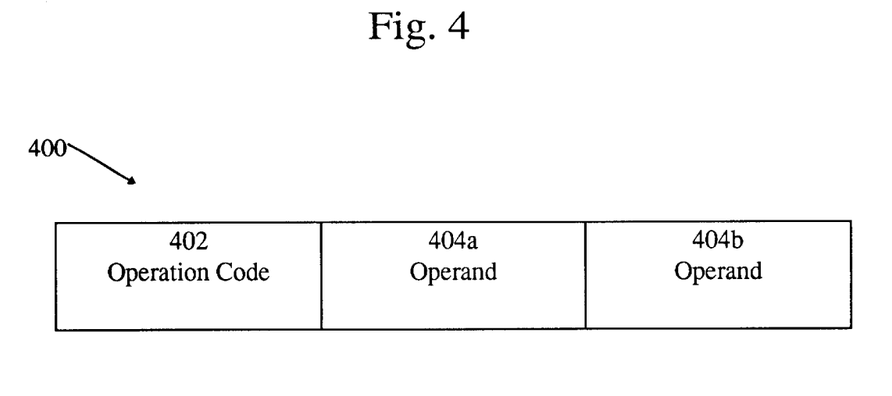
FIG. 4 is an exemplary format of a typical computer program instruction.

In a preferred embodiment of the present invention, the data to be compressed are computer program instructions. As shown in FIG. 4, such instructions typically comprise an operation code field 402 and one or more operand fields 404a–b. The contents of operation code field 402 specifies the operation that is to be performed by the instruction, and is typically located at or near the beginning of the instruction. The contents of the one or more operand fields 404a–b specify items that are to be operated upon by the instruction, and are typically located at the end of the instruction. Program instructions may be advantageously divided into a subset that includes operation codes and a subset that includes operands. Each subset may then be encoded using a different encoding method.

Figure 5A:
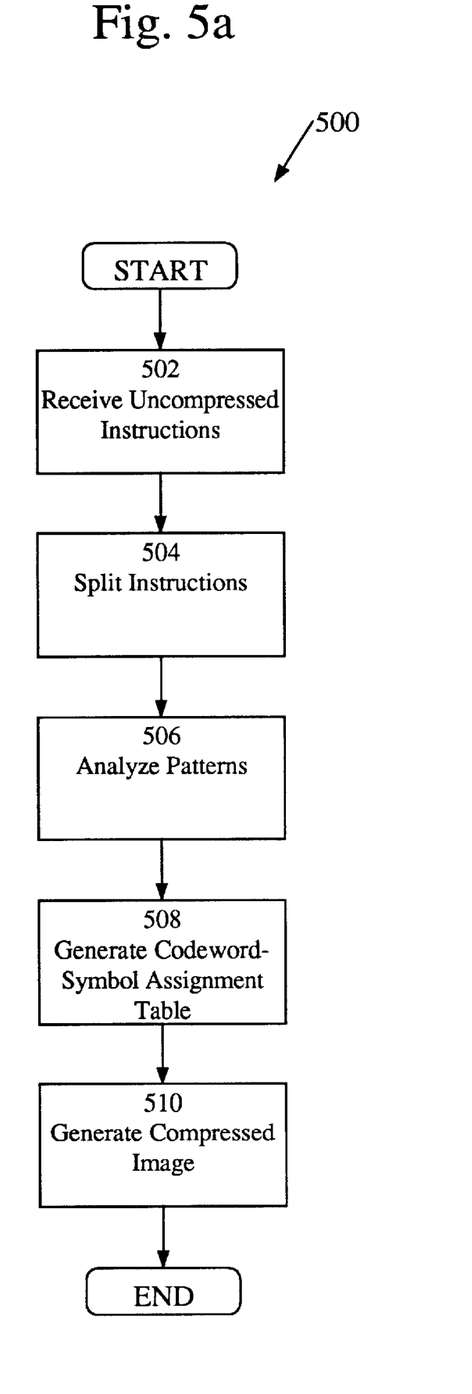
FIG. 5a is a flow diagram of a compression process, according to the present invention.
Figure 5B:
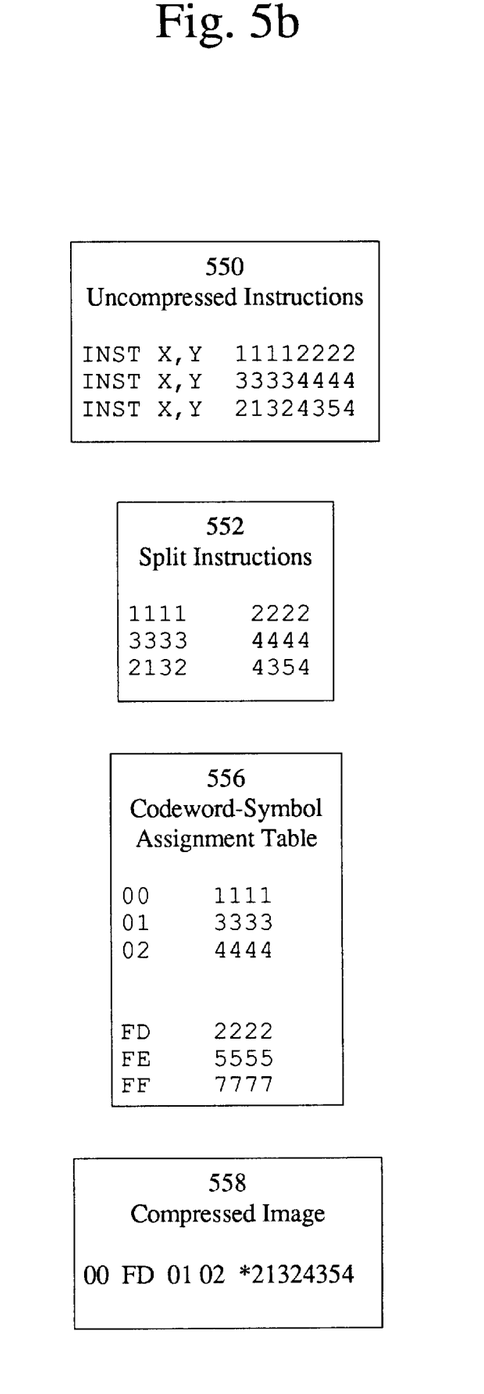

A compression process, according to the present invention, as applied to program instructions, is shown in FIG. 5a, which is best viewed in conjunction with FIG. 5b. The process begins with step 502, in which a block of uncompressed program instructions, such as block 550 of FIG. 5b; is received. In step 502, the instructions may be split into patterns or symbols of a desired size. For example, each 32-bit instruction shown in block 550 of FIG. 5b may be split into two 16-bit symbols, as shown in block 552 of FIG. 5b. In step 506, the symbols are analyzed to determine the frequency of occurrence of each symbol in the block of program instructions. In step 508, each symbol is assigned to a codeword, based on the frequency of occurrence of the symbol. The more frequently occurring symbols are assigned to the shorter codewords, while the less frequently occurring symbols are assigned to codewords that are not as short. A table of the resulting program codeword/symbol correspondences, termed a codeword-symbol assignment table, is generated. As described below, each codeword-symbol assignment table includes several symbol groups, arranged based on the length of the codeword to which the symbol has been assigned. In step 510, the block of program code is compressed by replacing each symbol with its assigned codeword.

Each block of program code compressed by process 500 may in fact be a subset of the input information. As shown in FIG. 3, the input information may be split into a plurality of un encoded subsets and each unencoded subset may be encoded using a different encoding method, resulting in a plurality of encoded subsets. As applied to process 500, this results in the entire program code being split into a plurality of blocks and encoded using a different codeword-symbol assignment table. This results in a plurality of encoded blocks, each using a different codeword-symbol assignment table that has been optimized for it particular block.

Figure 6A:
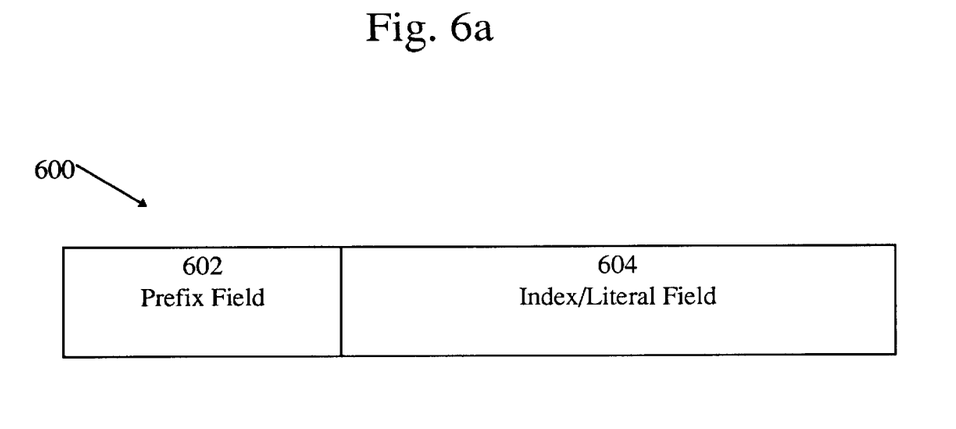
FIG. 6a is an exemplary format of a codeword generated by the compression process of FIG. 5a, according to the present invention.

An exemplary format of a codeword 600 is shown in FIG. 6a. Codeword 600 includes a prefix field 602 and an index/literal field 604. Prefix field 602 specifies the format of the contents of index/literal field 604 and specifies the symbol group in the codeword-symbol assignment table that contains the symbol that was replaced by the codeword. Index/literal field 664 contains either an index into the codeword-symbol assignment table that was generated in step 508 of FIG. 5, or the literal uncompressed data.

Prefix field 602 may be of variable length, with the requirement that it must be possible to unambiguously determine the length of the prefix field when reading the bits in order. A variable length prefix field allows more frequently occurring symbols to be encoded with fewer bits. The prefix field specifies the symbol group in the codeword-symbol assignment table that includes the replaced codeword. Preferably, one entry value of prefix field 602 is used to specify that field 604 contains the actual uncompressed data, known as a literal. This allows a codeword-symbol assignment table of limited size to be used, even in the case in which there are many infrequently occurring symbols.

Index field 604 specifies the location in the symbol group specified by the prefix field. Field 604 is also of variable size, which is likewise specified by the corresponding prefix field entry.

The encoding scheme is iteratively optimized so as to maximize compression for a given total codeword-symbol assignment table space. The input data set contains $N_D$ data items, each item a symbol of B bits, and the codeword-symbol assignment table contains space for $N_s$ symbols. A maximum prefix field length P is selected and all encoding schemes having a prefix field length less than or equal to P are examined. This allows the number of symbol groups that are used in the codeword-assignment table to be no greater than $n=2^P$, and the corresponding index field $I_n$. All combinations of length fields that satisfy the that the total codeword-symbol assignment table size is $N_s$ are examined.

For example, the encoding of an input data set comprising a large number of 16-bit symbols is shown in Table A. The contents of prefix field 602, and the corresponding format of index/literal field 604, are shown for this exemplary encoding.

TABLE A

| Prefix Field 602 | Index/Literal Field 604 | Length | Symbol Group | Comment |
|---|---|---|---|---|
| 00 | xxxxxxxx xxxxxxxx | 16 bit | N.A. | Literal Encoding |
| 01 | xxx | 3 bits | 1 | first 8 elements |
| 100 | xxxx | 4 bits | 2 | next 16 elements |
| 101 | xxxxx | 5 bits | 3 | next 32 elements |
| 110 | xxxxxx | 6 bits | 4 | next 64 elements |
| 111 | xxxxxxx | 7 bits | 5 | next 128 elements |

Table A describes an encoding scheme having a prefix field length P equal to 3. The total number of possible codeword-symbol assignment tables used can be no greater than $2^P=2^3=8$. Table A represents only one of a plurality of encoding schemes that meet these criteria. In this example, five symbol groups are used and one prefix field value is used to indicate literal encoding. Alternative encoding schemes that meet the criteria range from using one symbol group with literal encoding available, having a 1-bit prefix field and an 8-bit index field, to using seven symbol groups with literal encoding available, having a three bit prefix and a 5-bit index field.

For each selected encoding scheme, the input information set is encoded and the amount of resulting compression is noted. Another encoding scheme having a prefix field length less than or equal to P is then selected, the input information set is encoded using the new scheme, and the amount of compression resulting from the new scheme is noted. This process is repeated for all possible encoding schemes having a prefix field length less: than or equal to P. The scheme yielding the greatest compression is then selected for use.

Figure 6B:
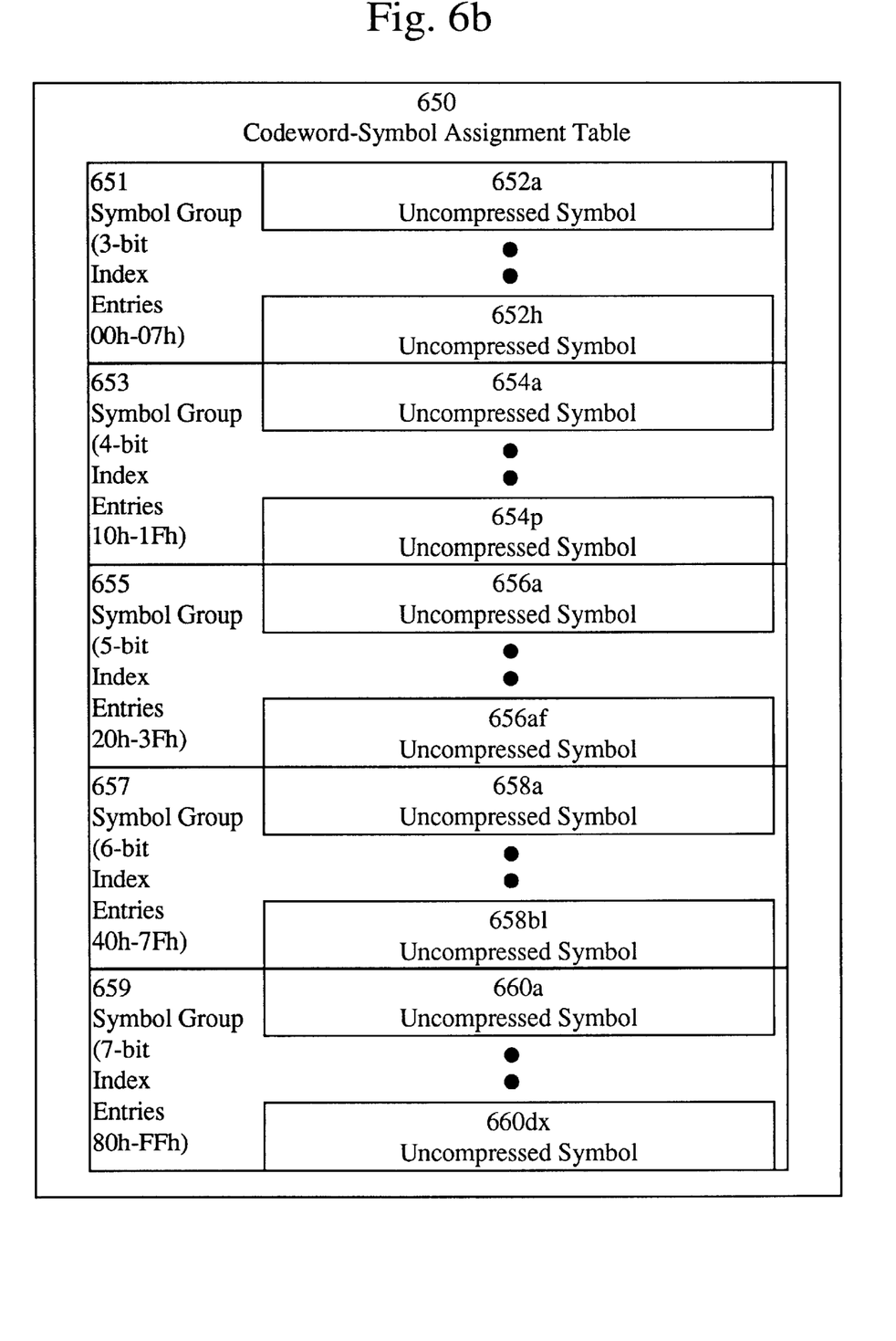
FIG. 6b is an exemplary block diagram of a codeword-symbol assignment table, according to the present invention, that uses an exemplary encoding scheme.

An exemplary codeword-symbol assignment table 650, which uses the encoding shown in Table A, is shown in FIG. 6b. Codeword-symbol assignment table 650 includes a plurality of symbol groups 651, 653, 655, 657 and 659, each symbol group corresponding to index entries of different lengths. Each symbol group includes a plurality of uncompressed symbol entries 652a–h, 654a–p, 656a–af, 658a–bl and 660a–dx, respectively, which are likewise grouped according to the bit length of the corresponding index entry. Symbol group 651, which includes symbol entries 652a–h, corresponds to 3-bit index entries in index/literal field 604 of Table A. Symbol group 653, which includes symbol entries 654a–p, corresponds to 4-bit index entries in index/literal field 604 of Table A. Symbol group 655, which includes symbol entries 656a–af, corresponds to 5-bit index entries in index/literal field 604 of Table A. Symbol group 657, which includes symbol entries 658a–bl, corresponds to 6-bit index entries in index/literal field 604 Of Table A. Symbol group 659, which includes symbol entries 660a–dx, corresponds to 7-bit index entries in index/literal field 604 of Table A.

Preferably, the compression and optimization processes are performed by software running on a programmed general-purpose computer system. The computational effort involved in the optimization process can be quite large. However, the computation is done only once during the choice of encoding scheme for a particular input data set. Thus, the computational effort should not present a problem in practice.

Figure 7A:
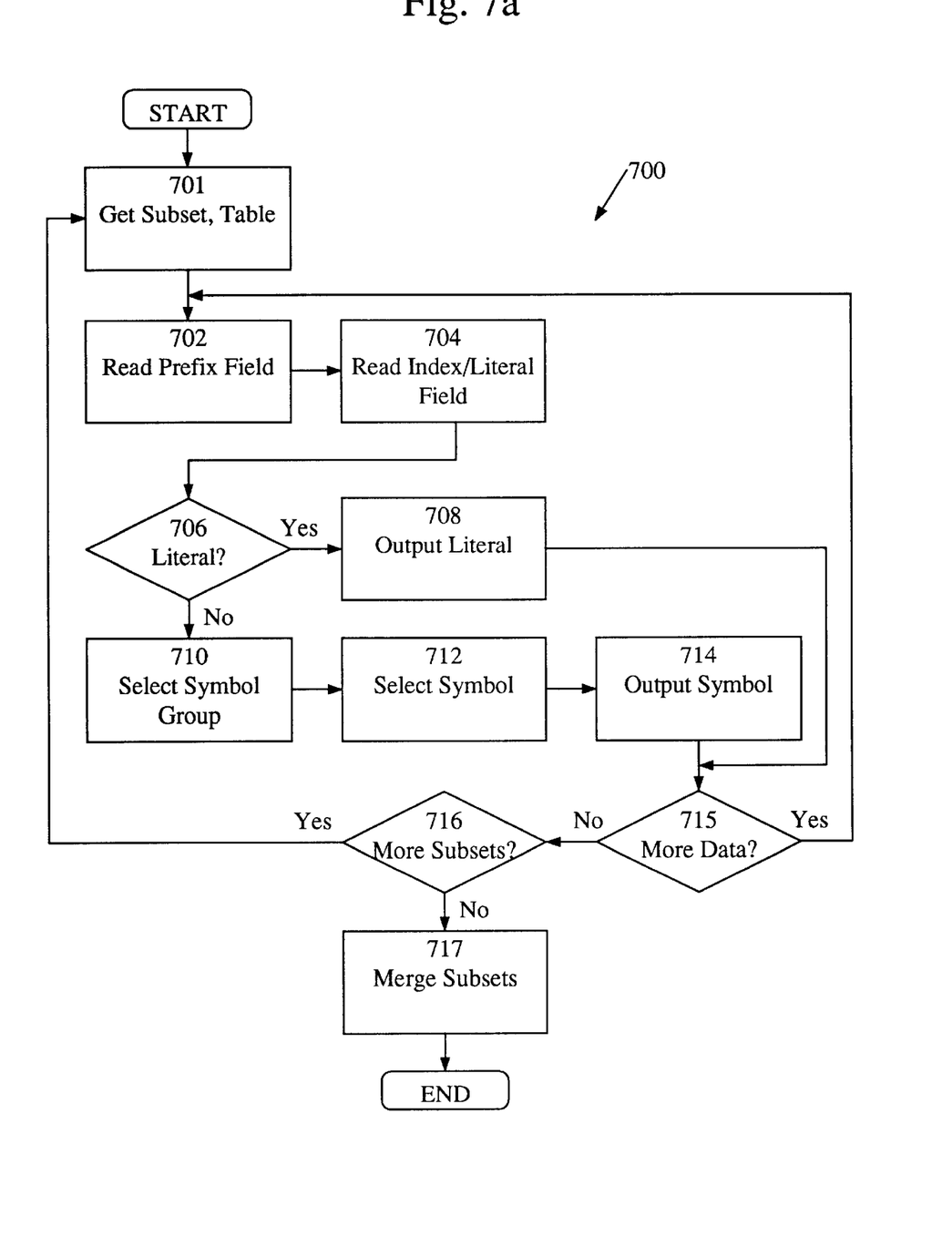
FIG. 7a is a flow diagram of a decompression process, according to the present invention, which is implemented in the decompression engine of FIG. 2.

A flow diagram of a decompression process, according to the present invention, is shown in FIG. 7a. Process 700 begins with step 701, in which an compressed subset and its corresponding codeword-symbol assignment table are gotten. In step 702, the prefix of a codeword in the compressed image is read. In step 704, the index/literal field of the codeword is read. In step 706, the prefix that was read is examined. If the prefix indicates that the index/literal field of the codeword contains a literal value, the process continues with step 708, in which the literal value is output, then continues with step 715, described below. If the prefix indicates that the index/literal field of the codeword contains an index value, the process continues with step 710, in which a symbol group in the codeword-symbol assignment table is selected based on the value of the prefix. In step 712, a symbol is selected from the selected symbol group based on the value of the index. In step 714, the selected symbol is output. In step 715, it is determine whether there is any more data in the current subset. If so, the process loops back to step 702, in which the prefix of the next codeword is read. If not, the process continues with step 716, in which it is determined whether there are any more subsets to be decompressed. If so, the process loops back to step 701, in which the next compressed subset and its corresponding codeword-symbol assignment table is gotten. If not, the process continues with step 717, in which the decompressed subsets are merged to reform the original input data.

Figure 7B:
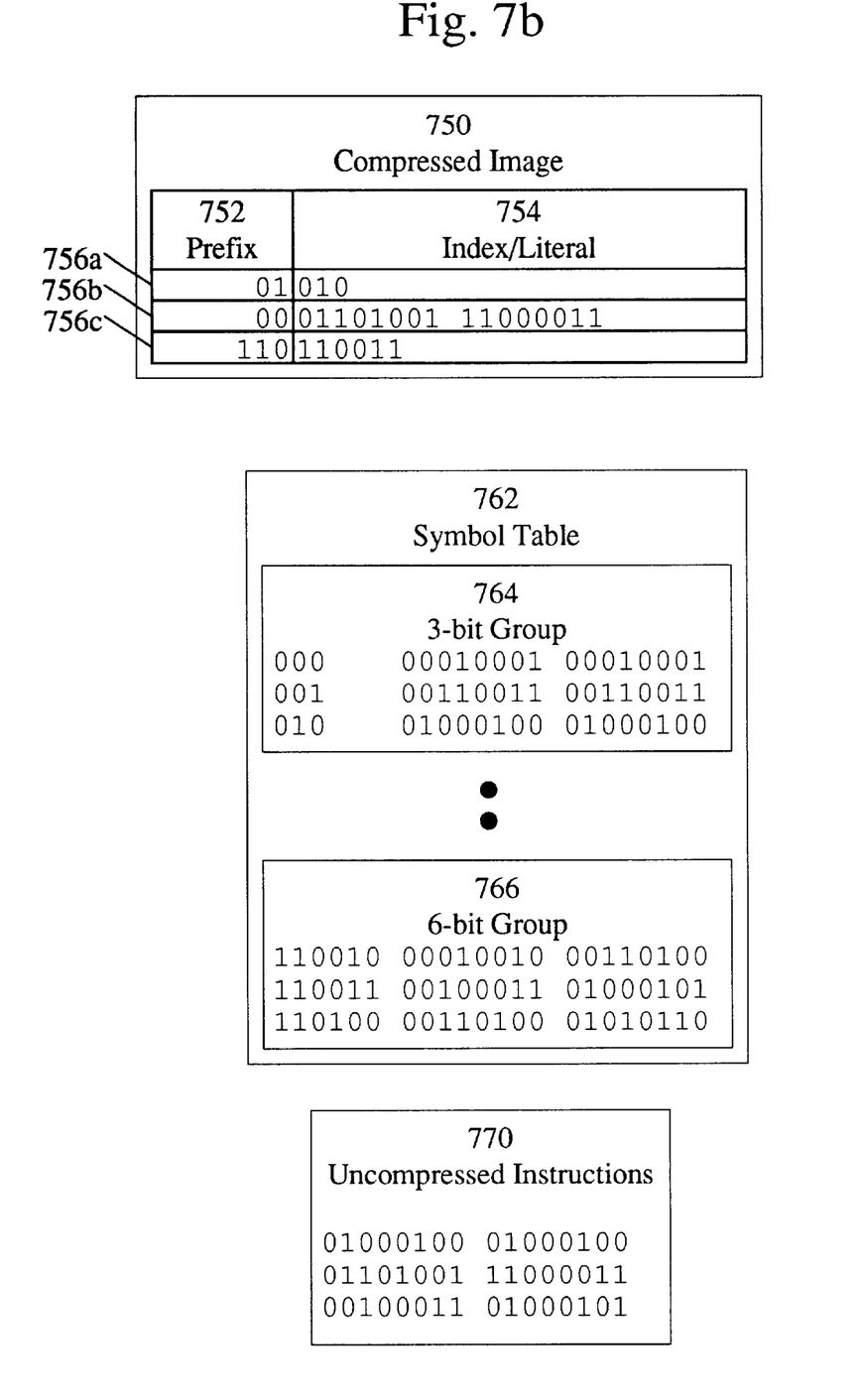

An example of the decompression of compressed computer program instructions, using the exemplary encoding shown in Table A, is shown in FIG. 7b. Compressed image 750 includes a plurality of codewords 756a–c. Each codeword includes a prefix field 752 and an index literal field 754. The prefix field and index/literal field of each codeword are read. For example, the prefix of codeword 756a, which is "01", and the index/literal field of codeword 756a, which is "010", are read. Prefix "01" indicates that the 3-bit symbol group 764 of codeword-symbol assignment table 762 is to be used. The entry in group 764 that corresponds to the index value is output to uncompressed instruction set 770. Here, index "010" corresponds to symbol "01000100 01000100". Codeword 756c has prefix "110", which indicates six bit symbol group 766 is to be used. Codeword 756c has index value "110011", which corresponds to symbol "00100011 01000101". Codeword 756b has prefix 00, which indicates that that codeword's index literal field contains a literal value, which is directly output to uncompressed instruction stream 770. Here, codeword 756b contains literal value "01101001 11000011".

Preferably, the decompression process is performed by special purpose hardware,.such as the decompression engine described above.

Although a specific embodiment of the present invention has been described, it will be understood by those of skill in the art that there are other embodiments which are equivalent to the described embodiment. Accordingly, it is to be understood that the invention is not to be limited by the specific illustrated embodiment, but only by the scope of the appended claims.

What is claimed is:

1. A method of compressing a computer program of executable instructions, comprising the steps of:

splitting each instruction of a plurality of the instructions of the program into a first symbol and a second symbol, the first symbol assigned to first subset and the second symbol assigned to a second subset, wherein each instruction of the plurality consists of one opcode and one or more operands, the first symbol comprising the opcode and the second symbol comprising the one or more operands;

assigning a first codeword to the first symbol representing a compressed form of the first symbol and assigning a second codeword to the second symbol representing a compressed form of the second symbol;

generating a first codeword-symbol assignment table for the first subset of symbols and a second codeword-symbol assignment table for the second subset of symbols; and storing the codewords of the first subset as a first image representing a first compressed split instruction and the code words of the second subset as a second image representing a second compressed split instruction, the first and second compressed split instructions representing a compressed form of the computer program.

2. The method of claim 1, further comprising the step of:

determining a frequency of occurrence of each symbol, for each subset.

3. The method of claim 2, wherein the assigning step comprises the step of:

assigning a codeword to each symbol, based on the frequency of occurrence of each symbol, for each subset.

4. The method of claim 3, wherein each codeword comprises:

an index indicating a location in a codeword-symbol assignment table; and a prefix indicating a length of the index.

5. The method of claim 4, wherein the generating step comprises the step of:

generating a plurality of symbol groups for each codeword-symbol assignment table.

6. The method of claim 3, wherein each codeword comprises:

an index indicating a location in one of a plurality of codeword-symbol assignment tables; and a prefix indicating a length of the index.

7. A method of decompressing a computer program of executable instructions, the program having been compressed by splitting each instruction of a plurality of the instructions of the program into a first symbol and a second symbol, wherein each instruction of the plurality consists of one opcode and one or more operands, the first symbol comprising the opcode and the second symbol comprising the one or more operands, the first symbol assigned to first subset and the second symbol assigned to a second subset, assigning a first codeword to the first symbol representing a compressed form of the first symbol and assigning a second codeword to the second symbol representing a compressed form of the second symbol, generating a first codeword-symbol assignment table for the first subset of symbols and a second codeword-symbol assignment table for the second subset of symbols, storing the codewords of the first subset as a first image representing a first compressed split instruction and the code words of the second subset as a second image representing a second compressed split instruction, the first and second compressed split instructions representing a compressed form of the program, the method of decompressing, comprising the steps of:

accessing the first compressed split instruction;

reading a codeword in the first compressed split instruction and looking up a first symbol in the first codeword-symbol assignment table;

outputting the first symbol as a formed symbol of the first subset;

accessing the second compressed split instruction;

reading a codeword in the second compressed split instruction and looking up a second symbol in the second codeword-symbol assignment table;

outputting the second symbol as a formed symbol of the second subset; and merging the first symbol of the first subset with the second symbol of the second subset to form a decoded instruction.

8. The method of claim 7, wherein each codeword comprises:

an index indicating a location in a codeword-symbol assignment table; and a prefix indicating a length of the index.

9. A computer program product for compressing a computer program of executable instructions, the computer program product, comprising:

program code for splitting each instruction of a plurality of the instructions of the program into a first symbol and a second symbol, the first symbol assigned to first subset and the second symbol assigned to a second subset, wherein each instruction of the plurality consists of one opcode and one or more operands, the first symbol comprising the opcode and the second symbol comprising the one or more operands;

program code for assigning a first codeword to the first symbol representing a compressed form of the first symbol and assigning a second codeword to the second symbol representing a compressed form of the second symbol;

program code for generating a first codeword-symbol assignment table for the first subset of symbols and a second codeword-symbol assignment table for the second subset of symbols;

program code for storing the codewords of the first subset as a first image representing a first compressed split instruction and the code words of the second subset as a second image representing a second compressed split instruction, the first and second compressed split instructions representing a compressed form of the computer program; and a medium to store said program codes.

10. A computer program product for decompressing a computer program of executable instructions, the program having been compressed by splitting each instruction of a plurality of the instructions of the program into a first symbol and a second symbol, wherein each instruction of the plurality consists of one opcode and one or more operands, the first symbol comprising the opcode and the second symbol comprising the one or more operands, the first symbol assigned to first subset and the second symbol assigned to a second subset, assigning a first codeword to the first symbol representing a compressed form of the first symbol and assigning a second codeword to the second symbol representing a compressed form of the second symbol, generating a first codeword-symbol assignment table for the first subset of symbols and a second codeword-symbol assignment table for the second subset of symbols, storing the codewords of the first subset as a first image representing a first compressed split instruction and the code words of the second subset as a second image representing a second compressed split instruction, the first and second compressed split instructions representing a compressed form of the program, the computer program product, comprising:

program code for accessing the first compressed split instruction;

program code for reading a codeword in the first compressed split instruction and looking up a first symbol in the first codeword-symbol assignment table;

program code for outputting the first symbol as a formed symbol of the first subset;

program code for accessing the second compressed split instruction;

program code for reading a codeword in the second compressed split instruction and looking up a second symbol in the second codeword-symbol assignment table;

program code for outputting the second symbol as a formed symbol of the second subset;

program code for merging the first symbol of the first subset with the second symbol of the second subset to form a decoded instruction; and a medium to store said program codes.

11. A system for compressing a computer program of executable instructions, the system comprising:

a processor; and a memory containing program instructions executable by the processor for performing the steps of:

splitting each instruction of a plurality of the instructions of the program into a first symbol and a second symbol, the first symbol assigned to first subset and the second symbol assigned to a second subset, wherein each instruction of the plurality consists of one opcode and one or more operands, the first symbol comprising the opcode and the second symbol comprising the one or more operands;

assigning a first codeword to the first symbol representing a compressed form of the first symbol and assigning a second codeword to the second symbol representing a compressed form of the second symbol;

generating a first codeword-symbol assignment table for the first subset of symbols and a second codeword-symbol assignment table for the second subset of symbols; and storing the codewords of the first subset as a first image representing a first compressed split instruction and the code words of the second subset as a second image representing a second compressed split instruction, the first and second compressed split instructions representing a compressed form of the computer program.

12. A system for decompressing a computer program of executable instructions, the program having been compressed by splitting each instruction of a plurality of the instructions of the program into a first symbol and a second symbol, wherein each instruction of the plurality consists of one opcode and one or more operands, the first symbol comprising the opcode and the second symbol comprising the one or more operands, the first symbol assigned to first subset and the second symbol assigned to a second subset, assigning a first codeword to the first symbol representing a compressed form of the first symbol and assigning a second codeword to the second symbol representing a compressed form of the second symbol, generating a first codeword-symbol assignment table for the first subset of symbols and a second codeword-symbol assignment table for the second subset of symbols, storing the codewords of the first subset as a first image representing a first compressed split instruction and the code words of the second subset as a second image representing a second compressed split instruction, the first and second compressed split instructions representing a compressed form of the program, the system for decompressing, comprising:

a processor; and a memory containing program instructions executable by the processor for performing the steps of:

accessing the first compressed split instruction;

reading a codeword in the first compressed split instruction and looking up a first symbol in the first codeword-symbol assignment table;

outputting the first symbol as a formed symbol of the first subset;

accessing the second compressed split instruction;

reading a codeword in the second compressed split instruction and looking up a second symbol in the second codeword-symbol assignment table;

outputting the second symbol as a formed symbol of the second subset; and merging the first symbol of the first subset with the second symbol of the second subset to form a decoded instruction.

13. A system for decompressing a computer program of executable instructions, the program having been compressed by splitting each instruction of a plurality of the instructions of the program into a first symbol and a second symbol, wherein each instruction of the plurality consists of one opcode and one or more operands, the first symbol comprising the opcode and the second symbol comprising the one or more operands, the first symbol assigned to first subset and the second symbol assigned to a second subset, assigning a first codeword to the first symbol representing a compressed form of the first symbol and assigning a second codeword to the second symbol representing a compressed form of the second symbol, generating a first codeword-symbol assignment table for the first subset of symbols and a second codeword-symbol assignment table for the second subset of symbols, storing the codewords of the first subset as a first image representing a first compressed split instruction and the code words of the second subset as a second image representing a second compressed split instruction, the first and second compressed split instructions representing a compressed form of the program, the system for decompressing, comprising:

accessing logic for accessing the first compressed split instruction;

look up logic coupled to the accessing logic, for reading a codeword in the first compressed split instruction and looking up a first symbol in the first codeword-symbol assignment table;

output logic coupled to the look up logic, for outputting the first symbol as a formed symbol of the first subset;

said accessing logic accessing the second compressed split instruction;

said look up logic reading a codeword in the second compressed split instruction and looking up a second symbol in the second codeword-symbol assignment table;

said output logic outputting the second symbol as a formed symbol of the second subset; and merging logic coupled to the output logic, for merging the first symbol of the first subset with the second symbol of the second subset to form a decoded instruction.

14. A method of compressing a computer program of executable instructions, comprising the steps of:

splitting each instruction of a plurality of the instructions of the program into a first symbol and a second symbol, the first symbol assigned to first subset and the second symbol assigned to a second subset, wherein each instruction of the plurality consists of one opcode and one or more operands, the first symbol comprising a first half of the instruction including at least part of the opcode and the second symbol comprising the second half of the instruction including at least part of the one or more operands;

assigning a first codeword to the first symbol representing a compressed form of the first symbol and assigning a second codeword to the second symbol representing a compressed form of the second symbol;

generating a first codeword-symbol assignment table for the first subset of symbols and a second codeword-symbol assignment table for the second subset of symbols; and storing the codewords of the first subset as a first image representing a first compressed split instruction and the code words of the second subset as a second image representing a second compressed split instruction, the first and second compressed split instructions representing a compressed form of the computer program.

15. The method of claim 14, wherein the instruction is a 32-bit instruction.

16. A system for decompressing a computer program of executable instructions, the program having been compressed by splitting each instruction of a plurality of the instructions of the program into a first symbol and a second symbol, wherein each instruction of the plurality consists of one opcode and one or more operands, the first symbol comprising a first half of the instruction including at least part of the opcode and the second symbol comprising the second half of the instruction including at least part of the one or more operands, the first symbol assigned to first subset and the second symbol assigned to a second subset, assigning a first codeword to the first symbol representing a compressed form of the first symbol and assigning a second codeword to the second symbol representing a compressed form of the second symbol, generating a first codeword-symbol assignment table for the first subset of symbols and a second codeword-symbol assignment table for the second subset of symbols, storing the codewords of the first subset as a first image representing a first compressed split instruction and the code words of the second subset as a second image representing a second compressed split instruction, the first and second compressed split instructions representing a compressed form of the program, the system for decompressing, comprising:

accessing logic for accessing the first compressed split instruction;

look up logic coupled to the accessing logic, for reading a codeword in the first compressed split instruction and looking up a first symbol in the first codeword-symbol assignment table;

output logic coupled to the look up logic, for outputting the first symbol as a formed symbol of the first subset;

said accessing logic accessing the second compressed split instruction;

said look up logic reading a codeword in the second compressed split instruction and looking up a second symbol in the second codeword-symbol assignment table;

said output logic outputting the second symbol as a formed symbol of the second subset; and merging logic coupled to the output logic, for merging the first symbol of the first subset with the second symbol of the second subset to form a decoded instruction.

17. The system of claim 16, wherein the instruction is a 32-bit instruction.

* * * * *